(12) United States Patent
Wang et al.

(10) Patent No.: US 11,682,647 B2
(45) Date of Patent: Jun. 20, 2023

(54) SEMICONDUCTOR PACKAGE AND METHOD FOR MANUFACTURING THE SAME

(71) Applicant: Taiwan Semiconductor Manufacturing Co., Ltd., Hsinchu (TW)

(72) Inventors: Po-Han Wang, Hsinchu (TW); Hung-Jui Kuo, Hsinchu (TW); Shih-Peng Tai, Hsinchu County (TW); Yu-Hsiang Hu, Hsinchu (TW); I-Chia Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 32 days.

(21) Appl. No.: 16/836,934

(22) Filed: Apr. 1, 2020

(65) Prior Publication Data
US 2021/0313292 A1    Oct. 7, 2021

(51) Int. Cl.
*H01L 23/00*    (2006.01)

(52) U.S. Cl.
CPC .............. *H01L 24/20* (2013.01); *H01L 24/19* (2013.01); *H01L 2224/2101* (2013.01); *H01L 2224/2105* (2013.01)

(58) Field of Classification Search
CPC . H01L 24/20; H01L 24/19; H01L 2224/2101; H01L 2224/2105
See application file for complete search history.

(56) References Cited

U.S. PATENT DOCUMENTS

| | | | |
|---|---|---|---|
| 8,762,900 B2 | 6/2014 | Shin et al. | |
| 8,796,666 B1 | 8/2014 | Huang et al. | |
| 8,812,999 B2 | 8/2014 | Liu et al. | |
| 8,850,366 B2 | 9/2014 | Liu et al. | |
| 8,906,595 B2 | 12/2014 | Liu et al. | |
| 8,954,899 B2 | 2/2015 | Wu et al. | |
| 9,093,530 B2 | 7/2015 | Huang et al. | |
| 9,367,655 B2 | 6/2016 | Shih et al. | |
| 9,390,217 B2 | 7/2016 | Wang et al. | |
| 9,548,303 B2 | 1/2017 | Lee et al. | |
| 2018/0047571 A1* | 2/2018 | Hunt | H01L 23/48 |
| 2019/0336103 A1* | 11/2019 | Fife | A61B 8/4483 |
| 2022/0165823 A1* | 5/2022 | Ichikawa | G09F 9/00 |

* cited by examiner

*Primary Examiner* — Timor Karimy
(74) *Attorney, Agent, or Firm* — JCIPRNET

(57) ABSTRACT

A semiconductor package including a plurality of semiconductor devices, an insulating layer, and a redistribution layer is provided. The insulating layer is disposed over the semiconductor device. The redistribution layer is disposed over the insulating layer and electrically connected to the semiconductor device. The redistribution layer includes a conductive line portion. The semiconductor package has a stitching zone, and the insulating layer has a ridge structure on a surface away from the semiconductor device and positioned within the stitching zone.

20 Claims, 17 Drawing Sheets

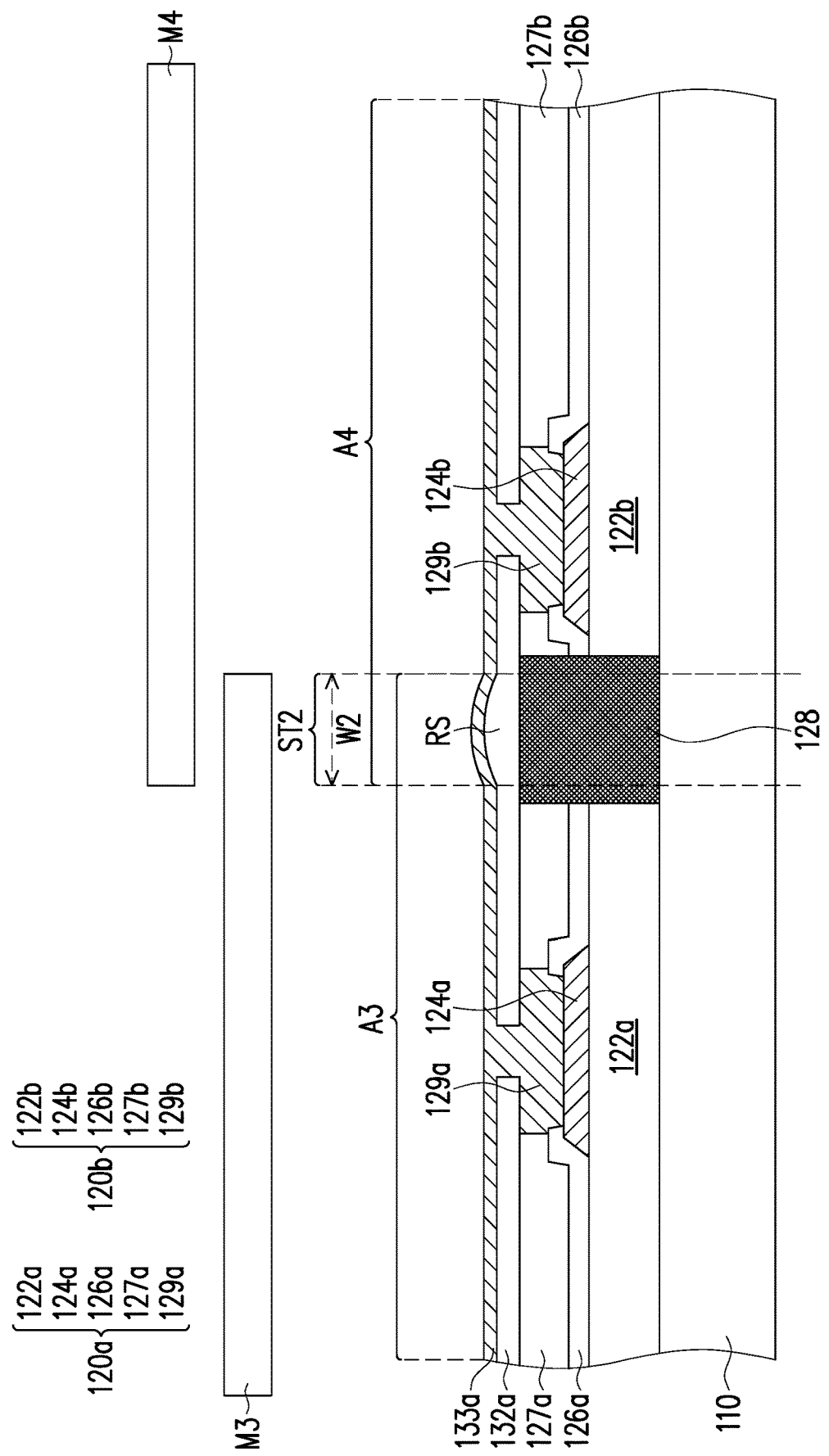

M1a

M2a

M1b

M2b

US 11,682,647 B2

SEMICONDUCTOR PACKAGE AND METHOD FOR MANUFACTURING THE SAME

BACKGROUND

The rapid growth of the semiconductor industry is mostly attributed to continuous improvements in the integration density of various electronic components (i.e., transistors, diodes, resistors, capacitors, etc.). For the most part, this improvement in integration density has come from repeated reductions in minimum feature sizes, which allows more of the smaller components to be integrated into a given area.

These integration improvements may reach physical limits to, for example, the resolution or the depth of focus of the photolithography exposures. Also, a fine-pitch patterning process performed on a semiconductor package with wafer having warpage or a fine-pitch patterning process performed on an ultra large package may be challenging, due to the nature of photolithography.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 1E are schematic cross-sectional views of resulted structures during various stages in a method for manufacturing a semiconductor package according to some exemplary embodiments of the disclosure.

DESCRIPTION OF THE EMBODIMENTS

Figure 1A:
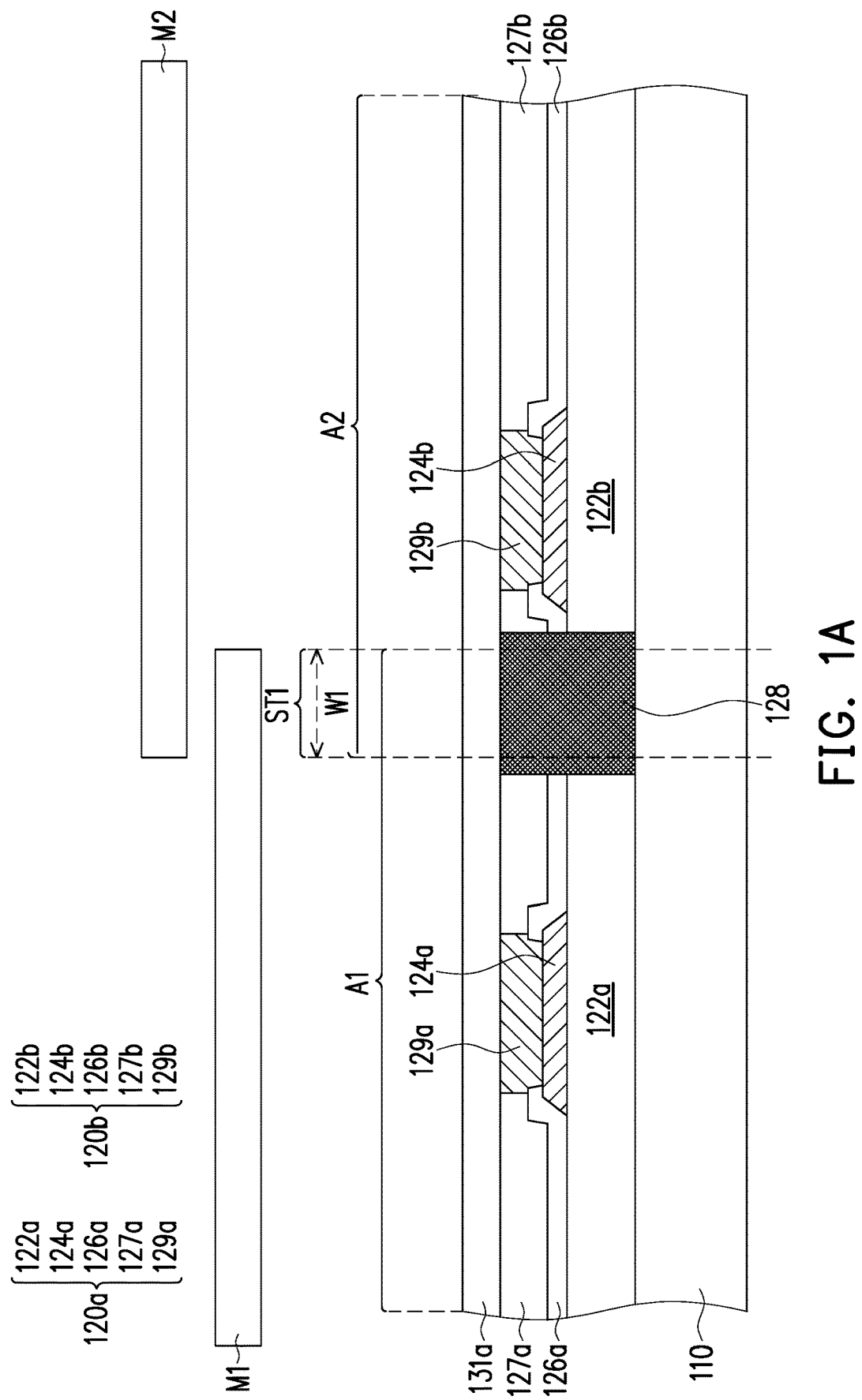

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

In this disclosure, various aspects of a semiconductor package and the method for manufacturing the same are described. The semiconductor package may be, for example, a system-in-package. In some embodiments, the method for manufacturing the semiconductor package may include multi-exposure photolithography process. The semiconductor package may include stitching zones within a single semiconductor package due to the multi-exposure photolithography process.

FIG. 1A to FIG. 1E schematically illustrates various stages in the method for manufacturing a semiconductor package. The resulted semiconductor package 100 may be shown in FIG. 1E and may be an ultra large package. In some instances, the semiconductor package 100 may be of a side length from about 15 mm to about 100 mm, or more. However, the disclosure is not limited thereto. In some embodiments, the semiconductor package 100 may have a size with a length smaller than 15 mm.

In FIG. 1A, one or more semiconductor devices 120a and 120b, which may be designed for an intended purpose such as a memory die (e.g., a DRAM die, a stacked memory die, a high-bandwidth memory (HBM) die, etc.), a logic die, a central processing unit (CPU) die, a system-on-a-chip (SoC), a component on a wafer (CoW), a package comprising one or more dies or devices, the like, or a combination thereof, may be disposed on a carrier substrate 110. FIG. 1A illustrates two semiconductor devices 120a and 120b as an exemplarily example, but the quantity of the semiconductor device is not limited thereto. In some embodiments, the semiconductor devices 120a and 120b may be integrated circuits, including the components such as transistors, capacitors, inductors, resistors, metallization layers, external connectors, and the like, therein, as desired for a particular functionality. In some embodiments, the semiconductor devices 120a and 120b may include the same type of components, or may include different types of components. In some embodiments, the semiconductor devices 120a and 120b are formed as parts of a wafer, and the wafer is then cut to form individual semiconductor devices 120a and 120b. The semiconductor devices 120a and 120b are arranged in a side-by-side manner, but in some embodiments, the semiconductor devices 120a and 120b may be placed in an alternative arrangement or configuration.

The semiconductor device 120a may include a die body 122a, a plurality of contact pads such as the contact pad 124a, and a passivation layer 126a. The semiconductor device 120b may include a die body 122b, a plurality of contact pads such as the contact pad 124b, and a passivation layer 126b. The contact pads 124a and 124b may be formed on the die body 122a and the die body 122b, respectively. A passivation layer 126a is formed on the die body 122a. A passivation layer 126b is formed on the die body 122b. The passivation layers 126a and 126b may be formed after the contact pads 124a and 124b, respectively, and the passivation layers 126a and 126b may cover the edge portions of the contact pads 124a and 124b. In other words, the edge portion of the contact pads 124a may be interposed between the top of the die body 122a and the passivation layer 126a, and the edge portion of the contact pads 124b may be interposed between the top of the die body 122b and the passivation layer 126b. In some instances, the semiconductor device 120a may further include a dielectric layer 127a and a plurality of conductors such as the conductor 129a, and the semiconductor device 120b may further include a dielectric layer 127b and a plurality of conductors such as the conductor 129b. The dielectric layer 127a is formed over the passivation layer 126a, and the dielectric layer 127b is formed over the passivation layer 126b. The dielectric layers 127a and 127b may be formed by a dielectric material such as low temperature polyimide (LTPI), for example. The passivation layer 126a and the passivation layer 126b may expose the contact pad 124a and the contact pad 124b, respectively, and the conductors 129a and 129b may be formed to be in physical contact with the contact pad 124a and the contact pad 124b, respectively. The dielectric layers 127a and 127b surround the conductors 129a and 129b such that the conductors 129a and 129b are formed to be embedded in the dielectric layers 127a and 127b.

In FIG. 1A, a molding compound 128 is formed at least laterally encapsulating the semiconductor devices 120a and 120b. The molding compound 128 is formed to surround the semiconductor devices 120a and 120b on all lateral sides without extending over the top surface of the semiconductor devices 120a and 120b. The molding compound 128 is formed to fill gaps between the semiconductor devices 120a and 120b. The molding compound 128 may be formed using compression molding, lamination, or the like. The molding compound 128 may be made of an epoxy-based complex or the like. In some embodiments, the top surfaces of the semiconductor devices 120a and 120b are not covered by the molding compound 128, and specifically, the conductors 129a and 129b and the dielectric layers 127a and 127b are exposed. The conductors 129a and 129b and the dielectric layers 127a and 127b may form a common top surface with the molding compound 128. In some embodiments, the top surfaces of the conductors 129a and 129b and the dielectric layers 127a and 127b are substantially level with the top surface of the molding compound 128. In some embodiments, the top surfaces of the conductors 129a and 129b and the dielectric layers 127a and 127b may be lower than the top surface of the molding compound 128.

Further, as shown in FIG. 1A, an insulating material layer 131a may be formed over the conductors 129a and 129b and the dielectric layers 127a and 127b of the semiconductor devices 120a and 120b and over the molding compound 128. The insulating material layer 131a may be made of a negative-type photo-sensitive material such as polybenzoxazole (PBO), polyimide (PI), benzocyclobutene (BCB), a combination thereof or the like. The insulating material layer 131a may be deposited by a coating process, laminating process, the like, or a combination thereof.

Figure 1B:
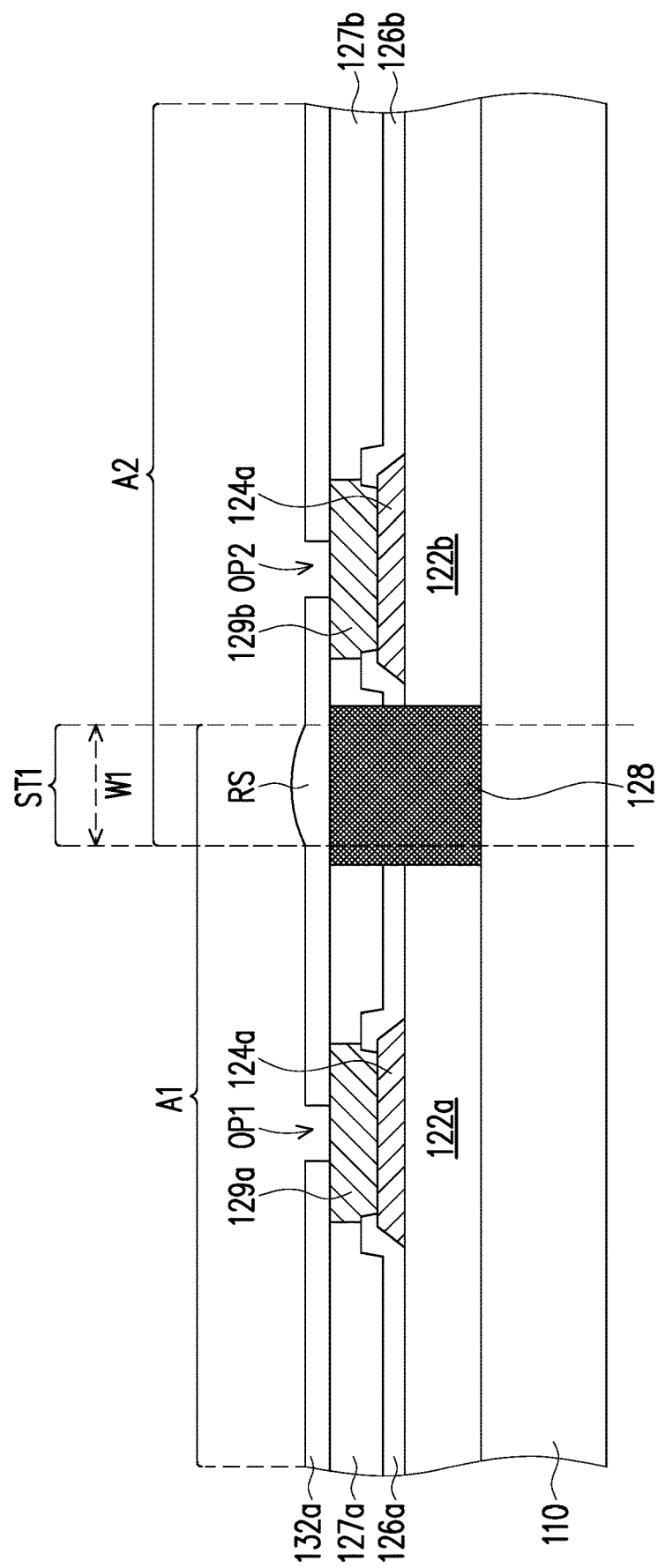

Referring to FIG. 1A and FIG. 1B, a photolithography processes may be performed to pattern the insulating material layer 131a of FIG. 1A. In some embodiments, the photolithography process may include performing a first exposure by using a first mask M1 to provide a first pattern on a first region A1 of the insulating material layer 131a, and performing a second exposure sequentially by using a second mask M2 to provide a second pattern on a second region A2 of the insulating material layer 131a. In some embodiments, the first exposure and the second exposure may undergo different conditions of exposure, for example, the effective focal length, the exposure energy, the resolution, the depth of focus, or a combination of these factors.

The first region A1 and the second region A2 may cover different portions of the insulating material layer 131a, and the first region A1 may overlap the second region A2 at a first stitching zone ST1 shown in FIG. 1A. In some embodiments, a width W1 of the first stitching zone ST1 where the first region A1 overlapping the second region A2 is about 1 μm to about 100 μm, for instance, from about 1 μm to about 3 μm. In some instances, the stitching zone ST1 observed in the top view direction may be in a shape of straight line, while in some other instances, the stitching zone ST1 may be in a bent shape, L-shape, or other suitable shape. The first pattern provided by the first mask M1 may be the same as or different from the second pattern provided by the second mask M2, while the first pattern and the second pattern may be identical within the first stitching zone ST1.

In some embodiments, a developing process may then be performed after the first exposure and the second exposure to form the insulating layer 132a as shown in FIG. 1B. The insulating layer 132a may include openings OP1 and OP2 that may expose the conductors 129a and 129b of the semiconductor devices 120a and 120b. In some embodiments, through the photolithography processes, the insulating layer 132a may include a ridge structure RS formed in the first stitching zone ST1 as the insulating material in the stitching zone ST being exposed by both the first exposure and the second exposure. In other words, the insulating material layer 131a may include negative-type photo-sensitive materials, which may undergo chemical changes through the exposure. Specifically, the exposed region of the negative-type photo-sensitive materials would become dense and have sufficient resistance to a developer while the unexposed regions of the negative-type photo-sensitive materials would be soluble and removable by the developer. Accordingly, the unexposed regions of the negative-type photo-sensitive materials may be removed by the developer and the exposed region of the negative-type photo-sensitive materials remains. The negative-type photo-sensitive materials within the stitching zone ST may become more dense and insoluble than other portions of the insulating material layer 131a, for example, due to doubled exposure by the first exposure and the second exposure, while other portions of the insulating material layer 131a endured less exposure may still be soluble in a low degree. The difference in solubility may result in less dissolution within the stitching zone ST, such that the ridge structure RS that is relatively higher than the adjacent regions as shown in FIG. 1B may be formed.

In FIG. 1C, a metal layer 133a may be formed over the insulating layer 132a. In the embodiment in FIG. 1C, the metal layer 133a may fill the openings OP1 and OP2 of the insulating layer 132a to be in physical contact with the conductors 129a and 129b. In some embodiments, the metal layer 133a may be formed by forming a seed layer on the insulating layer 132a and growing a conductive layer on the seed layer. The seed layer may be made of copper, titanium, titanium nitride, titanium nitride, a combination of copper and titanium (Ti/Cu), the like, or a combination thereof, and deposited on the insulating layer 132a by atomic layer deposition (ALD), sputtering, another physical vapor deposition (PVD) process, or the like. The conductive layer may be made of copper, copper alloys, aluminum, aluminum alloys, tungsten, tungsten alloys, or combinations thereof, and formed by a plating process, such as electroless plating, electroplating, or the like. In some embodiments, the metal layer 133a may conform to the underlying ridge structure RS of the insulating layer 132a within the first stitching zone ST1.

Figure 1D:
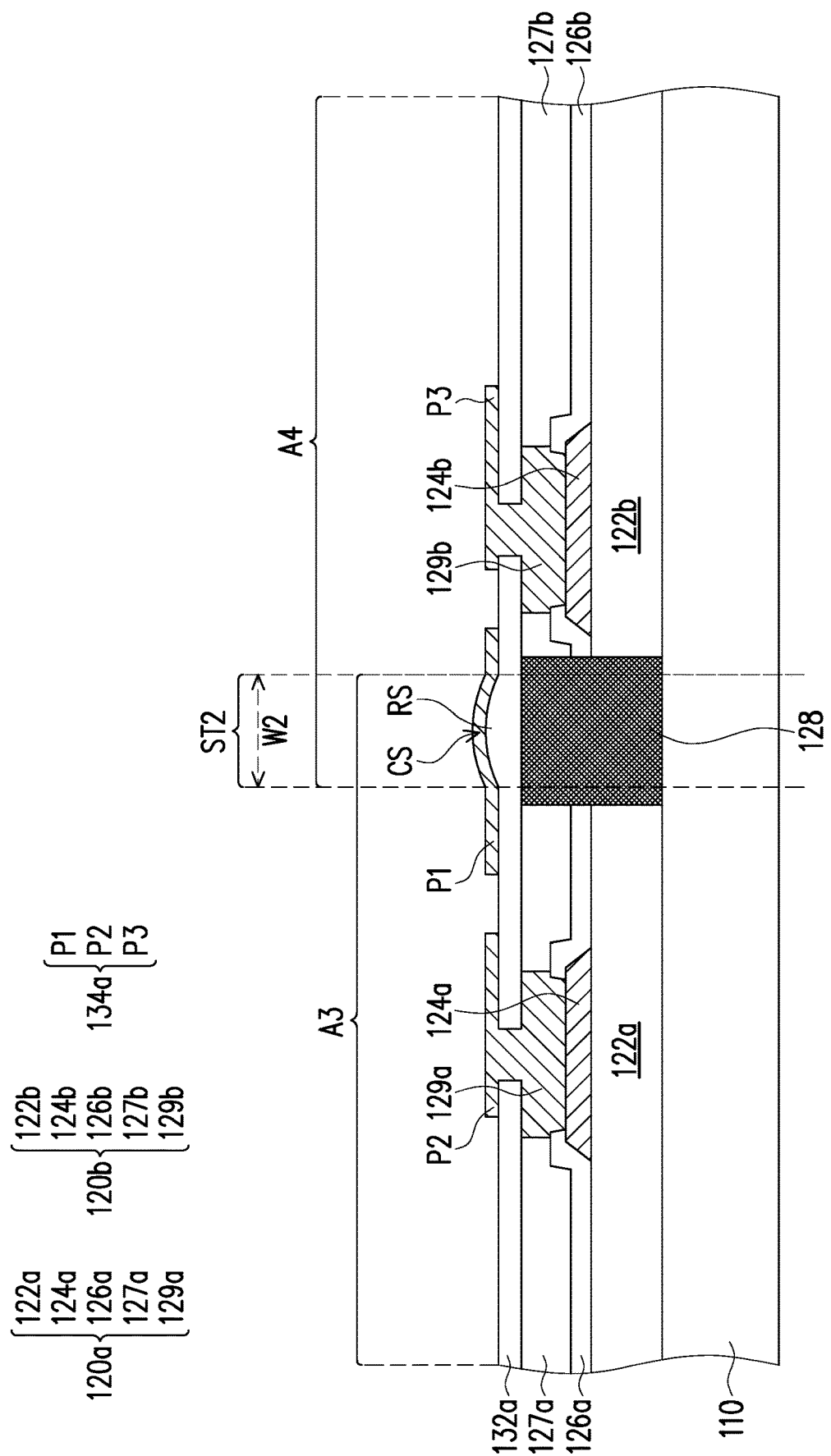

Referring to FIG. 1C and FIG. 1D, a photolithography and etching process may be performed to pattern the metal layer 133a. In some embodiments, a photoresist layer (not shown) may be formed on the metal layer 133a and patterned to form a photoresist pattern layer. The photolithography process may include performing a third exposure by using a third mask M3 to provide a third pattern on a third region A3 of the photoresist layer, and performing a fourth exposure sequentially by using a fourth mask M4 to provide a fourth pattern on a fourth region A4 of the photoresist layer. In some embodiments, the third exposure and the fourth exposure may undergo different conditions of exposure, for example, the effective focal length, the exposure energy, the resolution, the depth of focus, or a combination of these factors.

The third region A3 and the fourth region A4 may cover different portions of the photoresist layer, and the third region A3 may overlap the fourth region A4 at a second stitching zone ST2 shown in FIG. 1C. In some embodiments, a width W2 of the second stitching zone ST2 where the third region A3 overlapping the fourth region A4 is about 1 μm to about 100 μm, for instance, from about 1 μm to about 3 μm. In some instances, the second stitching zone ST2 observed in the top view direction may be in a shape of straight line, while in some other instances, the second stitching zone ST2 may be in a bent shape, L-shape, or other suitable shape. The third pattern provided by the third mask M3 may be the same as or different from the fourth pattern provided by the fourth mask M4, while the third pattern and the fourth pattern may be identical within the second stitching zone ST2.

The metal layer 133a may be patterned by an etching process using the photoresist pattern layer as mask to form the redistribution layer 134a. The redistribution layer 134a may include a conductive line portion P1 extending across and conforming to the underlying ridge structure RS of the insulating layer 132a to form a curved section CS. In FIG. 1D, the redistribution layer 134a may also include other conductive line portions P2 and P3 extending into the openings OP1 and OP2 of the insulating layer 132a that exposing the conductors 129a and 129b, such that the conductive line portions P2 and P3 of the redistribution layer 134a may be electrically connected to the semiconductor devices 120a and 120b, respectively, through the conductors 129a and 129b and/or the contact pads 124a and 124b.

In the embodiment, the second stitching zone ST2 shown in FIG. 1D may overlap the first stitching zone ST1 shown in FIG. 1B. Nevertheless, in other embodiments, the first stitching zone ST1 and the second stitching zone ST2 may not be overlapped. In the embodiment, the first stitching zone ST1 shown in FIG. 1B and the second stitching zone ST2 shown in FIG. 1D are located at a region between the semiconductor devices 120a and 120b, e.g. the region where the molding compound 128 is. In other embodiments, the first stitching zone ST1 and the second stitching zone ST2 may overlap at least one of the semiconductor devices 120a and 120b.

Figure 1E:
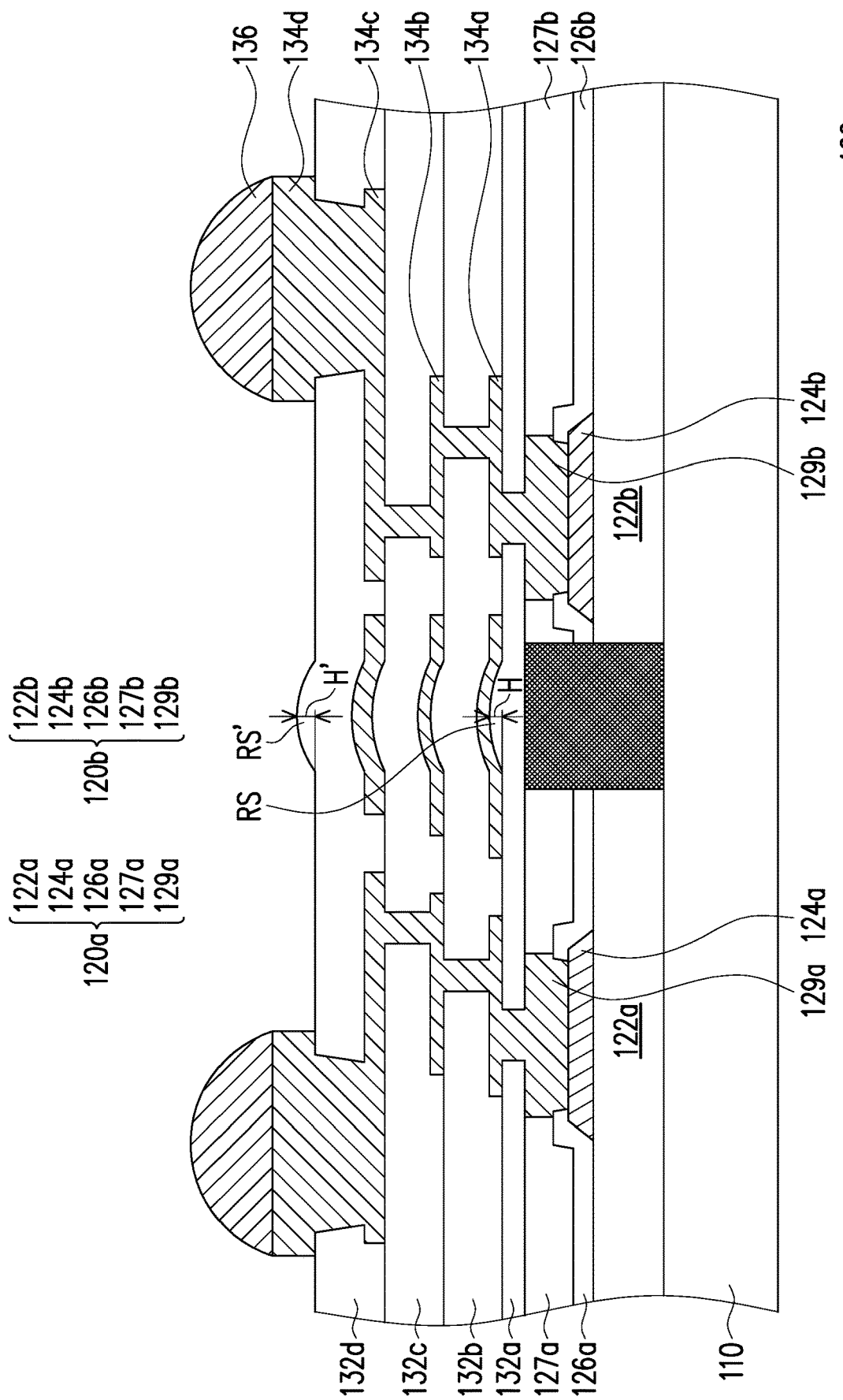

Subsequently, a plurality of insulating layers and a plurality of redistribution layers, for example, the insulating layer 132b, the redistribution layer 134b, the insulating layer 132c, the redistribution layer 134c, the insulating layer 132d, and the redistribution layer 134d, as shown in FIG. 1E, may be stacked sequentially on the insulating layer 132a and redistribution layer 134a to form the semiconductor package 100. The number of the insulating layers or the redistribution layers is not limited by the disclosure. In FIG. 1E, the insulating layers 132b, 132c, and 132d may be formed by using a method similar to that of forming the insulating layer 132a and have respective stitching zones similar to the first stitching zone ST1, and the redistribution layers 134b, 134c, and 134d may be formed by using a method similar to that of redistribution layer 134a and have stitching zones similar the second stitching zone ST2. In other embodiments, the stitching zones may be overlapped, not overlapped, or partially overlapped in accordance with actual requirements. In some instances, the semiconductor package 100 may further include conductive bumps 136 electrically connected to the redistribution layers 134d. In the embodiments that the stitching zones are overlapped or partially overlapped, the protrusions of the ridge structures may be added up such that a ridge structure RS' at the uppermost insulating layer 132d may have a protrusion greater than the ridge structure RS at the lower insulating layer 132a, in other words, the height H' of the ridge structure RS' protruded from the adjacent region may be larger than the height H of the ridge structure RS protruded from the adjacent region.

Figure 2:
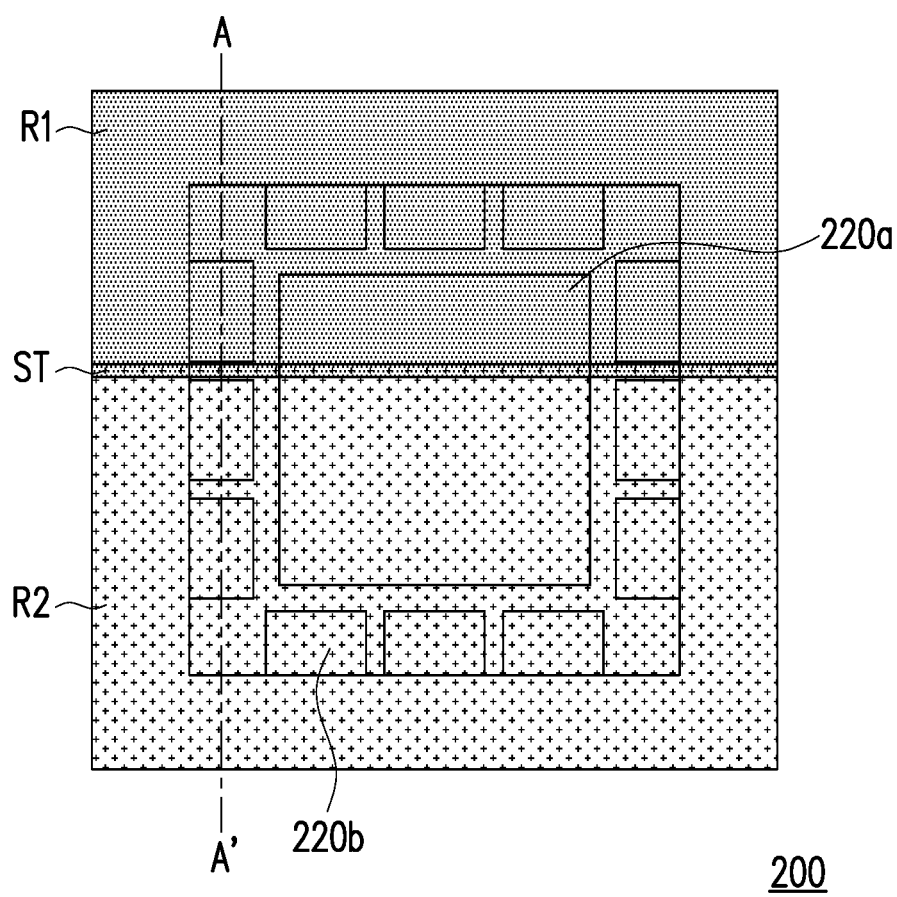
FIG. 2 is schematic top view of a semiconductor package in accordance with some embodiments of the disclosure.

FIG. 2 is a schematic top view of a semiconductor package 200 similar to the semiconductor package 100 in FIG. 1E. In FIG. 2, the semiconductor package 200 may include semiconductor devices 220a and 220b. The semiconductor devices 220a and 220b may have cross section structures similar to the semiconductor devices 120a and 120b in FIG. 1E. FIG. 2 shows one single semiconductor device 220a surrounding by a plurality of semiconductor devices 220b, however, the number of the semiconductor devices is not limited by the disclosure. In some embodiments, the semiconductor devices 220b may be similar to the semiconductor devices 220a.

The semiconductor package 200 in FIG. 2 may include regions R1 and R2, and a stitching zone ST. Each of the regions R1 and R2 represents an exposure area provided by a photolithography device within a single exposure, and the regions R1 and R2 cover different portions on the semiconductor package 200 and overlap at the stitching zone ST. The regions R1 and R2 and the stitching zone ST may be understood as the first region A1, the second region A2, and the first stitching zone ST1 in FIGS. 1A and 1B, or the third region A3, the fourth region A4, and the second stitching zone ST2 in FIGS. 1C and 1D. The stitching zone ST may be arranged in accordance with actual requirements, for example, in the embodiment of FIG. 2, the stitching zone ST is located at a region between two adjacent semiconductor devices 220b and extend over the semiconductor device 220a. In some alternative embodiments, the stitching zone ST may overlap at least one of the semiconductor devices 220a and 220b. In addition, the semiconductor package 200 may include insulating layers and redistribution layers over the semiconductor devices 220a and 220b, and in the stitching zone ST of the semiconductor package 200, the ridge structure RS and/or RS' may be formed in at least one of the insulating layers.

Figure 3:
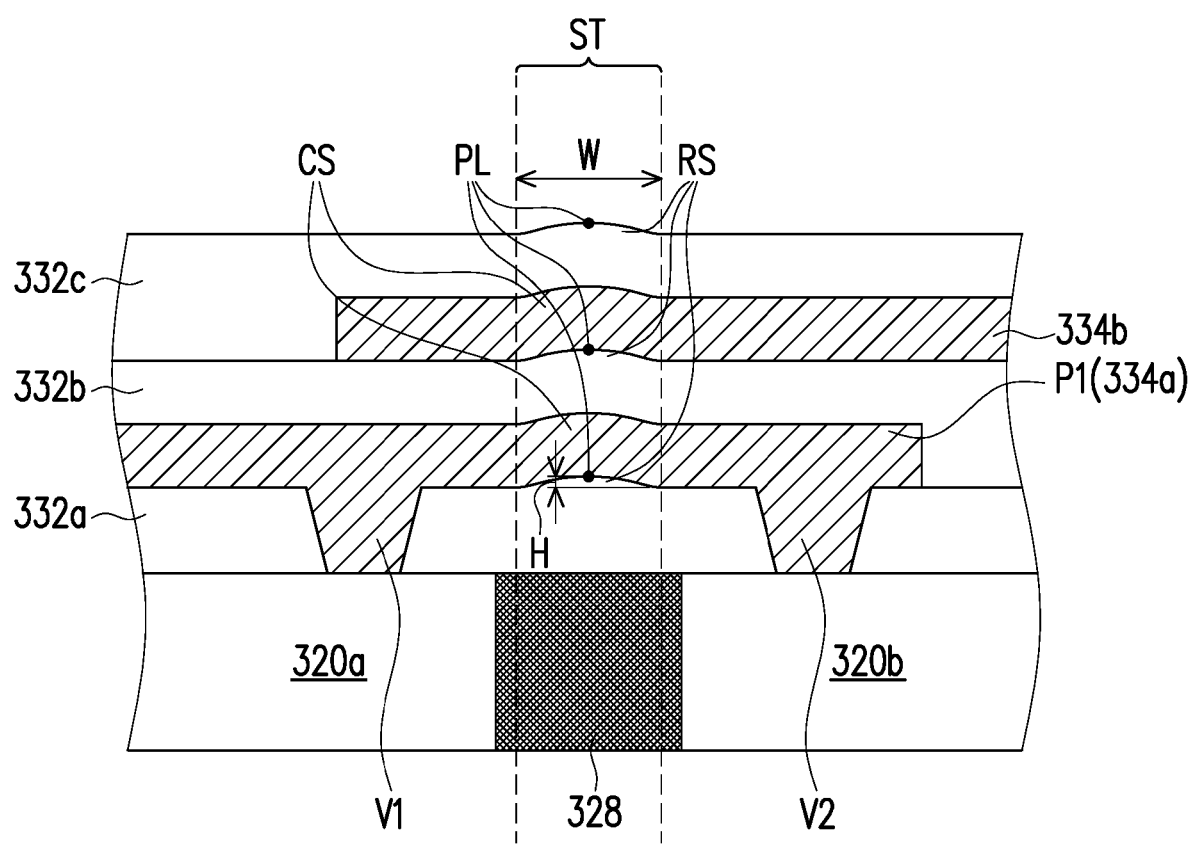
FIG. 3 is a schematic cross-sectional view of a semiconductor package in accordance with some embodiments of the disclosure.

FIG. 3 schematically illustrates a cross-sectional view of a semiconductor package 300. The cross-sectional view shown in FIG. 3 is an exemplary embodiment of the cross section of the semiconductor package 200 taken along the line A-A'. Referring to FIG. 3, the semiconductor package 300 includes the semiconductor devices 320a and 320b, the molding compound 328, the insulating layers 332a, 332b, and 332c, and the redistribution layers 334a and 334b. In FIG. 3, the semiconductor devices 320a and 320b and the molding compound 328 are similar to the semiconductor devices 120a and 120b and the molding compound 128 in FIGS. 1A to 1E. The insulating layers 332a, 332b, and 332c and redistribution layers 334a and 334b are similar to insulating layers 132a, 132b, and 132c and redistribution layers 134a and 134b in FIG. 1E. In FIG. 3, the semiconductor devices 320a and 320b may be disposed on a carrier substrate (not shown). The molding compound 328 is formed to surround the semiconductor devices 320a and 320b on all lateral sides without extending over the top surface of the semiconductor devices 320a and 320b. The insulating layer 332a is disposed over the semiconductor device 320a and 320b and the molding compound 328, and the redistribution layer 334a is disposed over the insulating layer 332a. The redistribution layer 334a may include a conductive line portion P1. In the embodiment of FIG. 3, the redistribution layer 334a may also include vias V1 and V2, and the redistribution layer 334a may be electrically connected to the semiconductor devices 320a and 320b through the vias V1 and V2. In the embodiment of FIG. 3, the insulating layer 332b, the redistribution layer 334b, and the insulating layer 332c may be stacked sequentially on the insulating layer 332a and the redistribution layer 334a. In some embodiments, the semiconductor package 300 may be an ultra large package with side length from about 15 mm to about 100 mm, or more. However, in some embodiments, the semiconductor package 300 may be of a side length less than 15 mm. In some instances, a width of the semiconductor package 300 may be above 33 mm.

The insulating layers 332a, 332b, and 332c may include a photo-sensitive material, in some instances, the insulating layers 332a, 332b, and 332c may include negative-type photosensitive material, such as polybenzoxazole (PBO), polyimide (PI), benzocyclobutene (BCB), a combination thereof or the like. In the embodiment of FIG. 3, the semiconductor package 300 has a stitching zone ST, and the insulating layers 332a, 332b, and 332c may have a ridge structure RS on a surface away from the semiconductor devices 320a and 320b within the stitching zone ST. As shown in FIG. 2 and FIG. 3, the ridge structure RS may be a ridge-like protrusion structure, or in other words, a continuously-extending protrusion structure extending along a substantially straight line in the semiconductor package 300. The ridge structure RS may be higher than the adjacent portions of the insulating layer 332a, and the apexes of the ridge structure RS may form a peak line PL. The ridge structure RS may have a width W from about 1 μm to about 100 μm, for instance, from about 1 μm to about 3 μm, wherein the size of the width W may be dependent on the width of the stitching zone ST where the insulating material layer (not shown) forming the insulating layer, for example, insulating layer 332a, is subjected to double exposures during the lithography process. The ridge structure RS may have a height H from about 0.1 μm to about 1 μm, wherein the height H of the ridge structure RS is calculated by the height difference of top the surface of the insulating layer, for example, the insulating layer 332a, between the peak line PL and the substantially flat portion outside and adjacent the stitching zone ST.

In some embodiments, the ridge structure RS observed in the top view direction may be in a shape of straight line across the semiconductor package 200, as shown in FIG. 2, however, in alternative embodiments, the ridge structure RS may be in a bent shape, L-shape, or other suitable shape observed in the top view direction.

In the embodiment of FIG. 3, the conductive line portion P1 of the redistribution layers 334a and 334b may include a curved section CS. The curved section CS may extend across the underlying ridge structures RS of the insulating layers 332a and 332b and conform to the protrusion of the ridge structures RS to form a protrusion section. In FIG. 3, the semiconductor package 300 may have a stitching zone ST, the ridge structures RS of the insulating layers 332a, 332b, and 332c and the curved sections CS of the redistribution layers 334a and 334b may be positioned within the stitching zone ST. In the present embodiment, the stitching zone ST is located at a region between the semiconductor devices 320a and 320b, while in some embodiments, the stitching zone ST may overlap at least one of the semiconductor devices 320a and 320b.

Figure 4A:
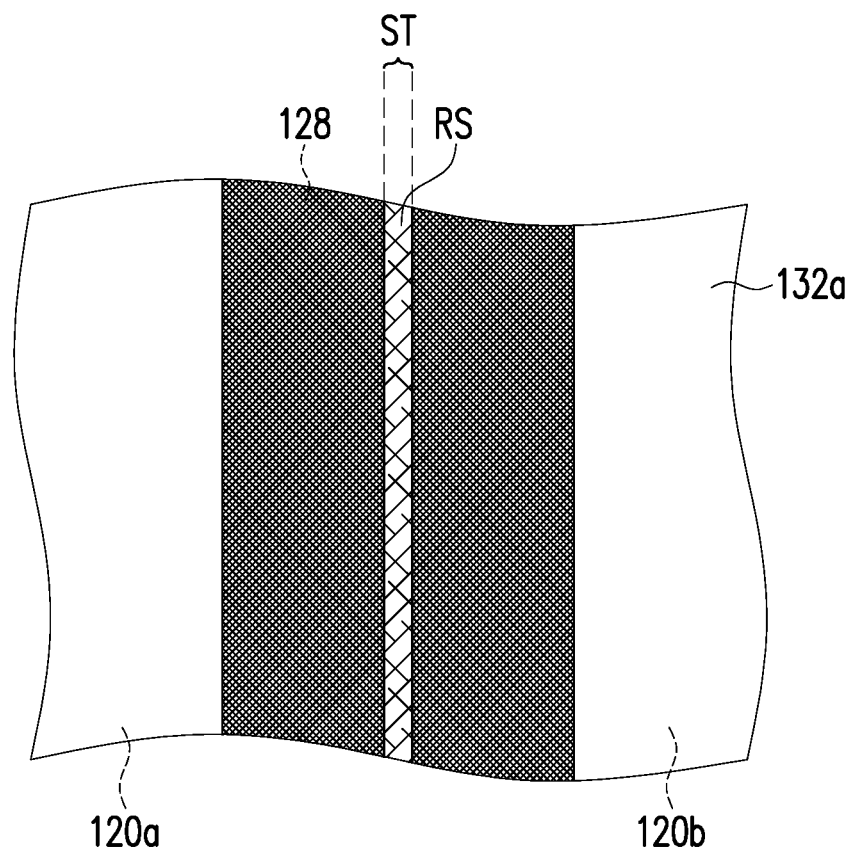
FIG. 4A is a schematic top view of a semiconductor package structure in accordance with some alternative embodiments of the semiconductor package structure of FIG. 1B.

FIG. 4A schematically illustrates a top view of an alternative semiconductor package structure similar to the semiconductor package structure of FIG. 1B. In FIG. 4A, the insulating layer 132a may have a ridge structure RS in the stitching zone ST above the molding compound 128. The stitching zone ST may be similar to the first stitching zone ST1 in FIG. 1B and the second stitching zone ST2 in FIG. 1D. The underlying molding compound 128 and the semiconductor devices 120a and 120b are shown in FIG. 4A since the insulating layer 132a may be light-permeable. In FIG. 4A the ridge structure RS may be positioned at a region between the semiconductor devices 120a and 120b, and the ridge structure RS of the insulating layer 132a may be in a line shape observed in the top view direction.

Figure 4B:
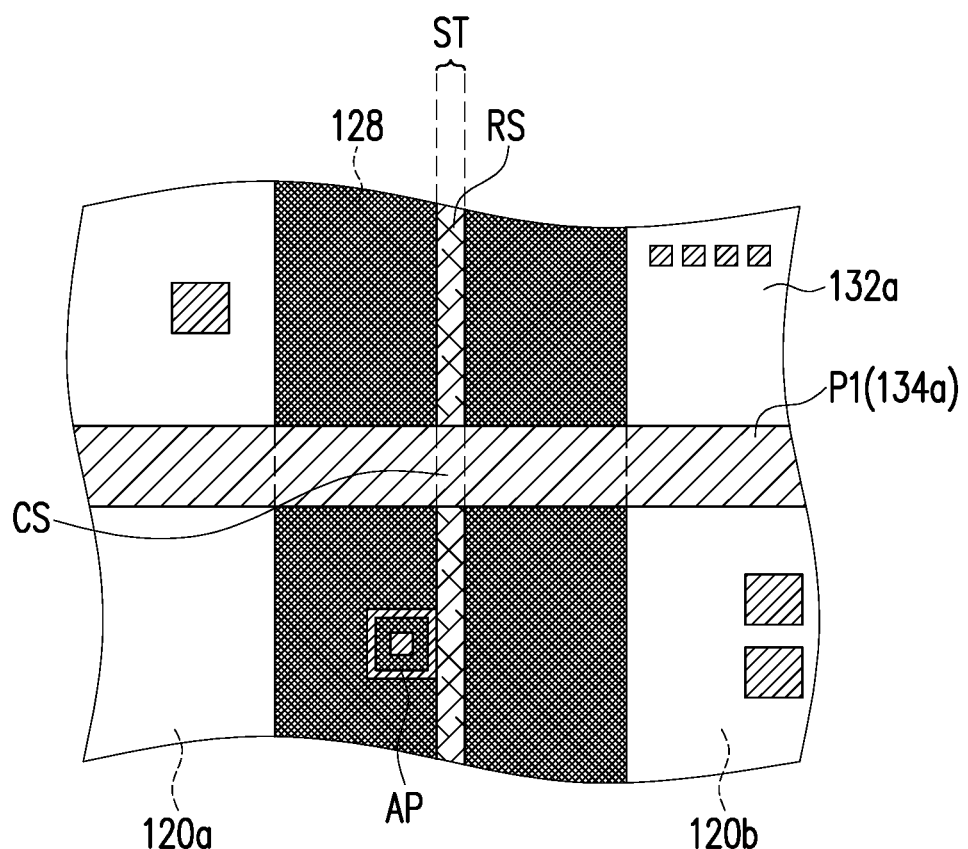
FIG. 4B is a schematic top view of a semiconductor package structure in accordance with some alternative embodiments of the semiconductor package structure of FIG. 1D.

FIG. 4B schematically illustrates a top view of an alternative semiconductor package structure similar to the semiconductor package structure of FIG. 1D. In FIG. 4B, the insulating layer 132a and the redistribution layer 134a disposed over the insulating layer 132a are shown. In the embodiment shown in FIG. 4B, the redistribution layer 134a may include a conductive line portion P1, and the conductive line portion P1 may extend across the ridge structure RS of the insulating layer 132a at a curved section CS, wherein the curved section CS conforms to the underlying ridge structure RS. The redistribution layer 134a may further include an alignment pattern AP. The alignment pattern AP may be positioned adjacent to the stitching zone ST. In FIG. 4B, the alignment pattern AP may be positioned over the molding compound 128 right next to the stitching zone ST. In some embodiments, the alignment pattern AP may be positioned over the semiconductor devices 120a and 120b or may partially or entirely overlap the stitching zone ST.

The alignment pattern AP may be formed in the same manufacturing method as the conductive line portion P1 and the alignment pattern AP may be positioned adjacent to the stitching zone ST such that the alignment pattern AP may be formed through, for example, the third exposure and the fourth exposure as discussed in FIGS. 1C and 1D. In this way, the alignment pattern AP may indicate whether of the exposures performed on the semiconductor package are properly aligned. The alignment pattern AP may include a pattern of concentric squares as shown in FIG. 4B, but in other embodiments, the alignment pattern AP may include a pattern of concentric circles or other suitable patterns.

Figure 5A:
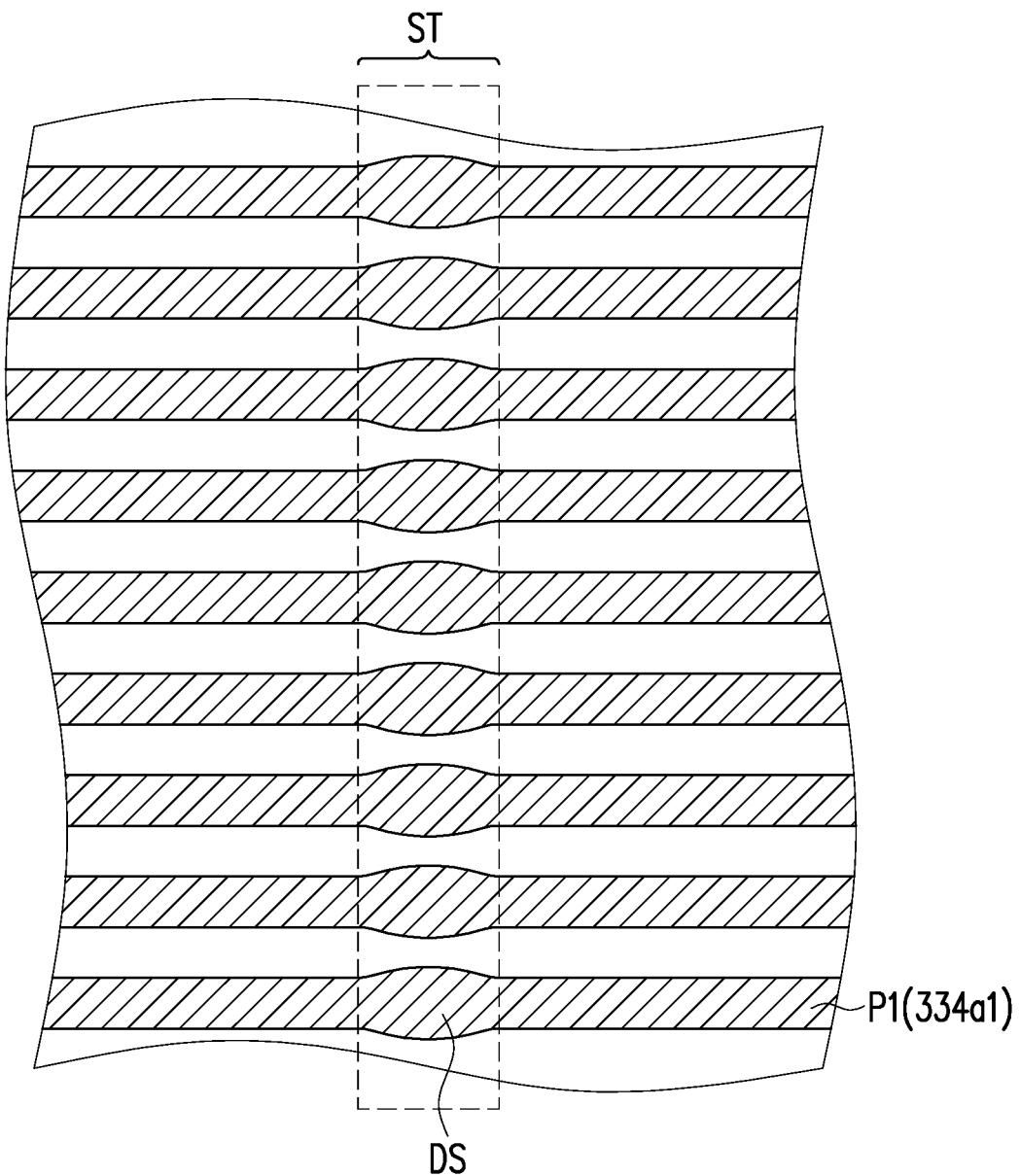
FIG. 5A to FIG. 6B are schematic cross-sectional views of semiconductor packages in accordance with some alternative embodiments of the semiconductor package of FIG. 3.
Figure 5B:
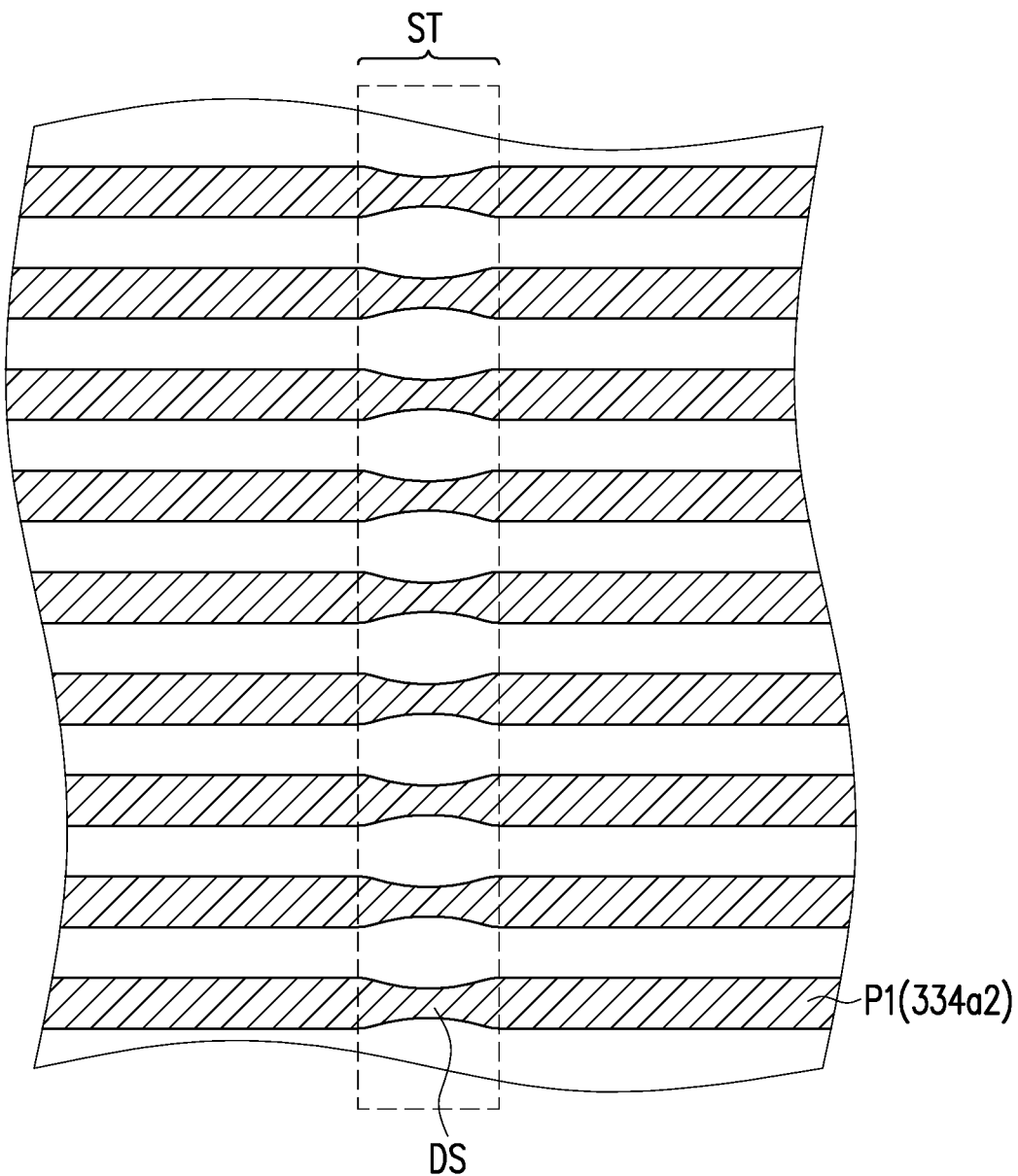

Referring to FIG. 5A to FIG. 5B. The cross-sectional views shown in FIG. 5A and FIG. 5B may be alternative embodiments of the top view structure of the layer of the conductive line portion P1 of the semiconductor package 300 of FIG. 3. FIG. 5A shows a stitching zone ST and at least one conductive line portion P1 of a redistribution layer 334a1. The stitching zone ST may be similar to the second stitching zone ST2 in FIG. 1D. In some instances, the stitching zone ST observed in the top view direction may be in a shape of straight line, while in some other instances, the stitching zone ST may be in a bent shape, L-shape, or other suitable shape. In the embodiment of FIG. 5A, the conductive line portion P1 of the redistribution layer 334a1 may extend across the stitching zone ST and include a deformed section DS at the stitching zone ST. The metal linewidth of the deformed sections DS may be different from other sections of the conductive line portion P1. In some embodiments, the metal linewidth of the deformed sections DS may be narrower or wider than other sections of the conductive line portion P1. In the embodiment shown in FIG. 5A, the deformed sections DS are of wider metal linewidths. FIG. 5B shows a stitching zone ST and at least one conductive line portion P1 of the redistribution layer 334a2. The redistribution layer 334a2 and the stitching zone ST in FIG. 5B are similar to the redistribution layer 334a1 and the stitching zone ST in FIG. 5A, except that the deformed sections DS in FIG. 5B are of narrower metal linewidths than other sections of the conductive line portion P1. In some other embodiments, a deformed sections DS may include some subsections with narrower metal linewidth and some subsections with wider metal linewidth, depending on the specific pattern provided to the metal layer.

The deformed sections DS shown in FIG. 5A to FIG. 5B may be formed as a result of the deformed portions of the photoresist layer in the stitching zone. For example, the redistribution layer 334a1 may be formed by a method similar to that of forming the redistribution layer 334a or 134a. Specifically, a metal material layer may be patterned by using a patterned photoresist layer as a mask to form the redistribution layer 334a1 and the patterned photoresist layer may be subjected to the exposure at different regions to have the required pattern while the patterned photoresist layer at the stitching zone ST is subjected to double exposures. When the patterned photoresist layer for the redistribution layer includes negative photoresists, the patterned photoresist layer in the stitching zone ST may become more insoluble for the developer than other portions due to extra exposure, such that the patterned photoresist layer in the stitching zone ST may be wider in width than the other portion and the deformed sections DS with wider metal linewidths as shown in FIG. 5A may be rendered in the stitching zone ST. On the other hands, when the photoresist layer includes positive photoresists, the patterned photoresist layer in the stitching zone ST may become more soluble due to extra exposure, such that the patterned photoresist layer in the stitching zone ST may be narrower in width than the other portion and the deformed sections DS with narrower metal linewidths as shown in FIG. 5B may be rendered in the stitching zone ST.

Figure 6A:
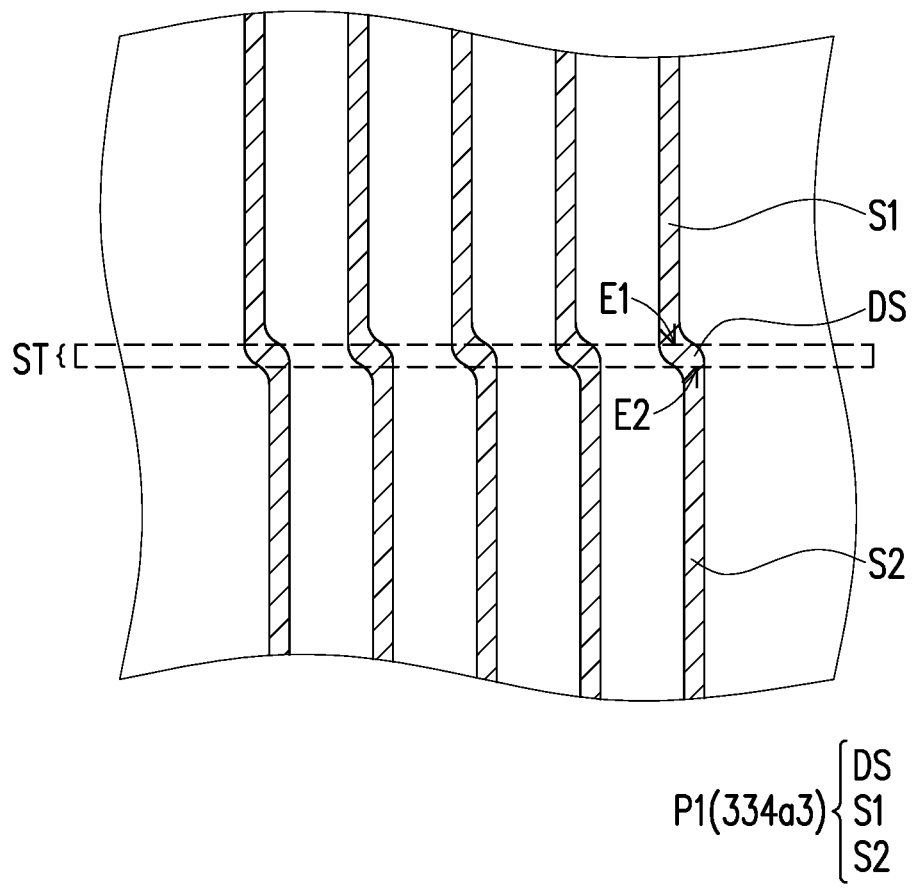
Figure 6B:
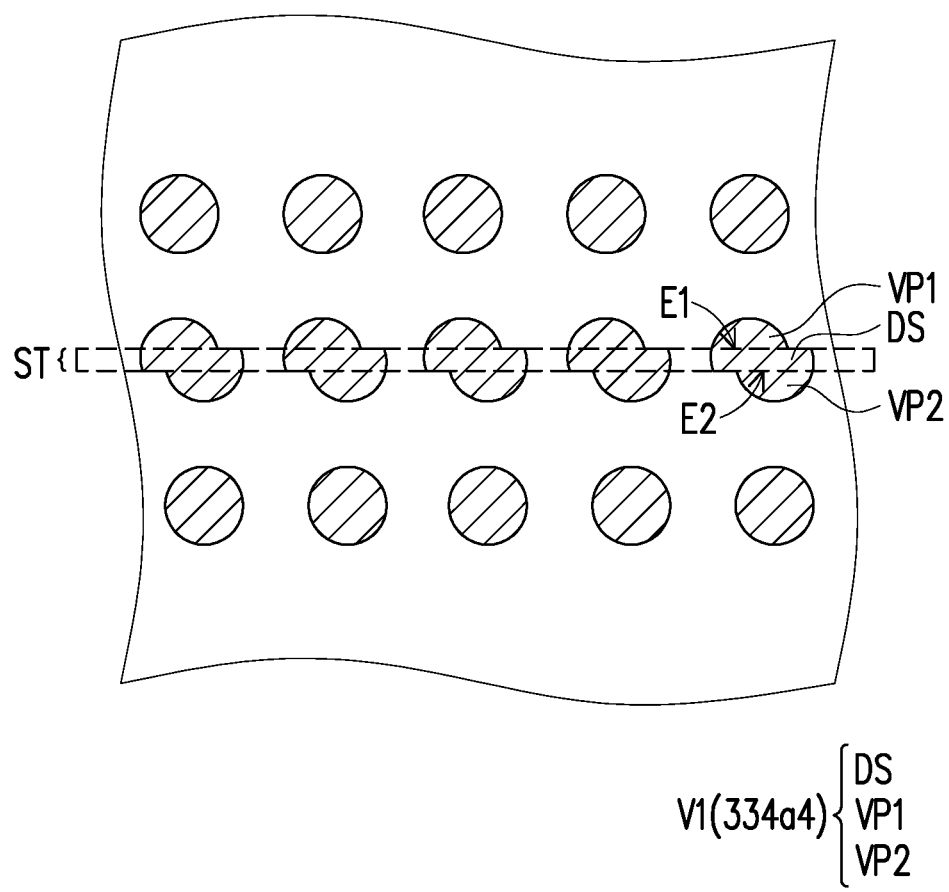

The cross-sectional views shown in FIG. 6A and FIG. 6B may be alternative embodiments of the top view structure of the layer of the conductive line portion P1 in the semiconductor package 300 of FIG. 3. FIG. 6A shows a stitching zone ST and at least one conductive line portion P1 of a redistribution layer 334a3. The stitching zone ST may be similar to the second stitching zone ST2 in FIG. 1D. In the embodiment of FIG. 6A, the conductive line portion P1 of the redistribution layer 334a3 may extend across the stitching zone ST and include a deformed section DS at the stitching zone ST. The conductive line portion P1 of the redistribution layer 334a3 may further include a first section S1 connected with a first end E1 of the deformed section DS and a second section S2 connected with a second end E2 of the deformed section DS. In the embodiment of FIG. 6A, the extension lines of the first section S1 and the second section S2 do not coincide. For example, as shown in FIG. 6A, the first section S1 and the second section S2 may be "shifted" slightly across the stitching zone ST. In some instances, the first sections and the second sections of the plurality of conductive line portions of the redistribution layer 334a3 may be "shifted" with similar offset.

FIG. 6B shows a stitching zone ST and at least one via V1 of a redistribution layer 334a4. The redistribution layer 334a4 and the stitching zone ST in FIG. 6B are similar to the redistribution layer 334a3 and the stitching zone ST in FIG. 6A. In the embodiment of FIG. 6B, the via V1 of the redistribution layer 334a4 may extend across the stitching zone ST and include a deformed section DS at the stitching zone ST. The via V1 of the redistribution layer 334a4 may further include a first portion VP1 connected with a first end E1 of the deformed section DS and a second portion VP2 connected with a second end E2 of the deformed section DS. In the embodiment of FIG. 6B, the via V1 of the redistribution layer 334a4 may be deformed such that, for example, the first portion VP1 and the second portion VP2 may be "shifted" slightly across the stitching zone ST. In some instances, the first portions and the second portions of the plurality of vias positioned across the stitching zone ST may be "shifted" by similar offset. The deformed sections DS and the non-coincident sections or portions, such as the first section S1 and the second section S2 in FIG. 6A and the first portion VP1 and the second portion VP2 in FIG. 6B, may result from the misalignment of the exposures overlapping with each other at the stitching zone ST.

Figure 7A:
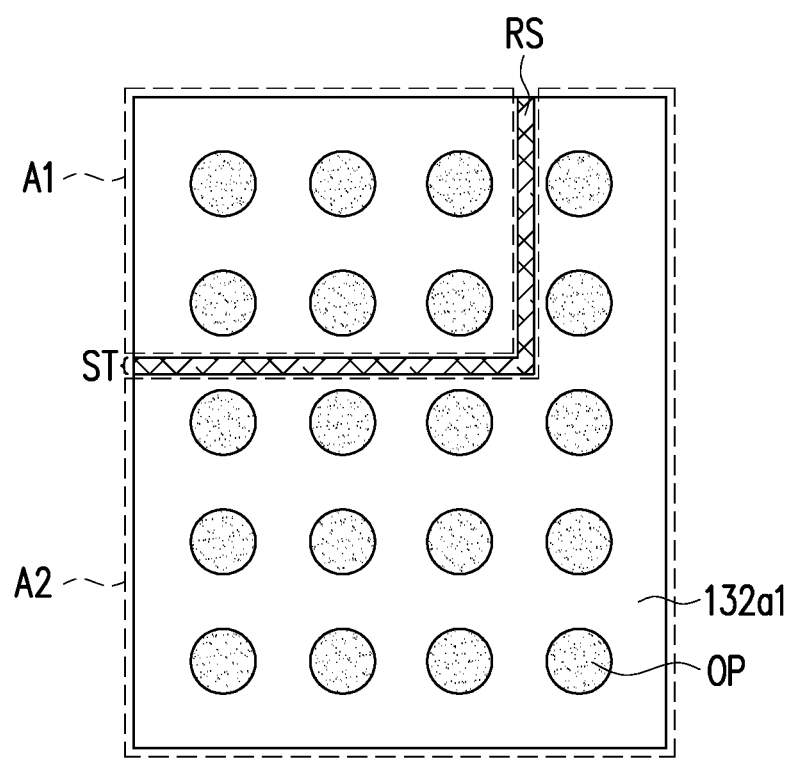
FIG. 7A is a schematic top view of a semiconductor package structure in accordance with some alternative embodiments of the semiconductor package structure of FIG. 1B.

FIG. 7A schematically illustrates an alternative embodiment of a top view of the semiconductor package structure of FIG. 1B. In FIG. 7A, an insulating layer 132a1 with a plurality of openings OP and a ridge structure RS in a stitching zone ST is shown. The insulating layer 132a1 may be similar to the insulating layer 132a of FIG. 1B. The insulating layers 132a1 may include negative-type photosensitive materials, such as polybenzoxazole (PBO), polyimide (PI), benzocyclobutene (BCB), a combination thereof or the like. In the embodiment shown in FIG. 7A, the stitching zone ST and the ridge structure RS are in L-shape. In the embodiment shown in FIG. 7A, the insulating layer 132a1 may further include a first region A1 and a second region A2 separated by the stitching zone ST. The difference between an average height of the top surface of the insulating layer 132a1 in the first region A1 and in the second region A2 may be more than 5 µm, or in some instances, from about 5 µm to about 10 µm, or more than 20 µm, such that the difference in height may cause intolerable defocus under a single exposure. By top surface, it is referred to the surface of the insulating layer faces away from the underlying semiconductor devices.

Figure 7B:
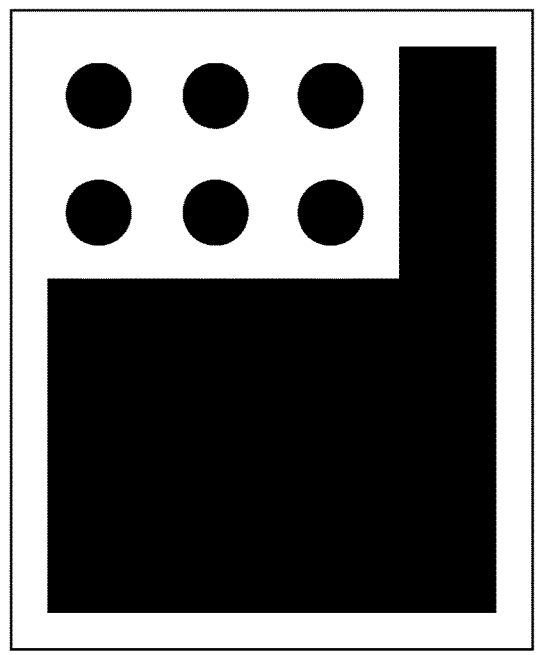
FIG. 7B and FIG. 7C are photomasks used in a method for manufacturing a semiconductor package structure of FIG. 7A according to some exemplary embodiments of the disclosure.
Figure 7C:
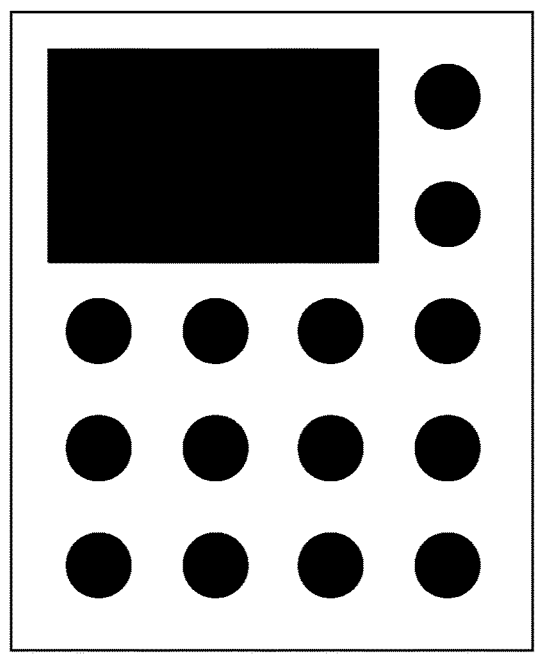

FIG. 7B and FIG. 7C show exemplary photomasks M1a and M2a used in a method for manufacturing the insulating layer 132a1 in the semiconductor package structure of FIG. 7A. The photomasks M1a in FIG. 7B may provide a first pattern on the first region A1 of the insulating layer 132a1 through a first exposure, and the photomasks M2a in FIG. 7C may provide a second pattern on the second region A2 of the insulating layer 132a1 through a second exposure. The exposure areas of the first exposure and the second exposure may overlap at a stitching zone ST. A ridge structure RS may be formed in the stitching zone ST after the developing process, for the negative-type photo-sensitive materials within the stitching zone ST may become more insoluble than other portions of the insulating material layer by being exposed twice during the first exposure and the second exposure.

Figure 8A:
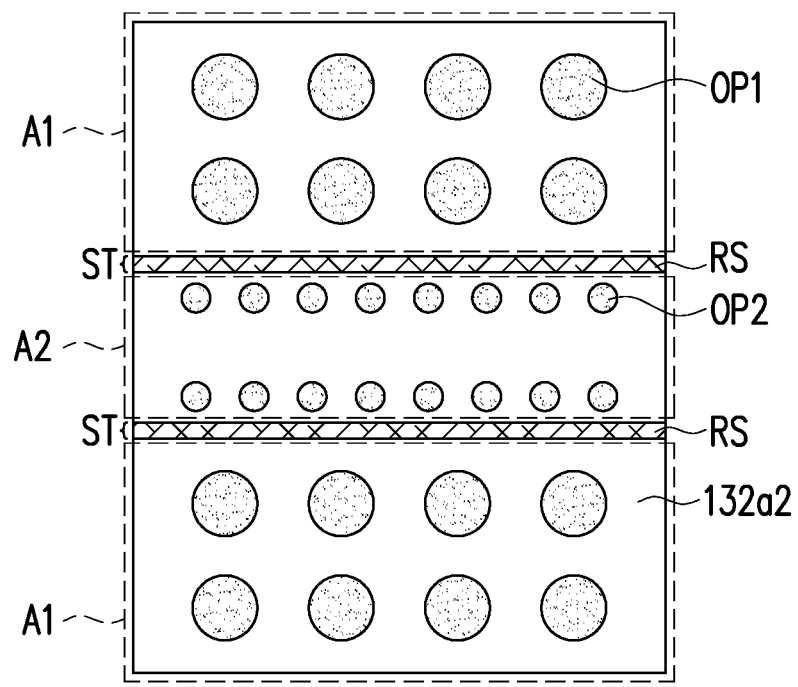
FIG. 8A is schematic top view of a semiconductor package structure in accordance with some alternative embodiments of the semiconductor package structure of FIG. 1B.

FIG. 8A schematically illustrates an alternative embodiment of a top view of the semiconductor package structure of FIG. 1B. In FIG. 8A, an insulating layer 132a2 with a plurality of openings OP1 and OP2 and ridge structures RS in stitching zones ST is shown. The insulating layer 132a2 may be similar to the insulating layer 132a1 in FIG. 7A. The insulating layers 132a2 may also include negative-type photosensitive materials as discussed above. In the embodiment shown in FIG. 8A, the insulating layer 132a2 may include two ridge structures RS located within two stitching zones ST. In the embodiment shown in FIG. 8A, a second region A2 is separated from two first regions A1 by the two stitching zones ST. The insulating layer 132a2 shown in FIG. 8A is only an exemplary embodiment, the number of the first regions, the second regions, and the stitching zones is not limited by the disclosure. In some embodiments, the minimum feature size of the features, for example, the openings OP1 and OP2, in the first region A1 and the second region A2 may be different. The term "minimum feature size" is used herein to refer to the minimum size of the individual features, such as the openings, the vias, the metal linewidths, the pitches, etc. in a given area. In some instances, the ratio of the minimum feature size in the first region A1 and the minimum feature size in the second region A2 may be larger than 2. In some instances, the difference between the minimum feature size in the first region A1 and the minimum feature size in the second region A2 may be larger than 10 μm.

Figure 8B:
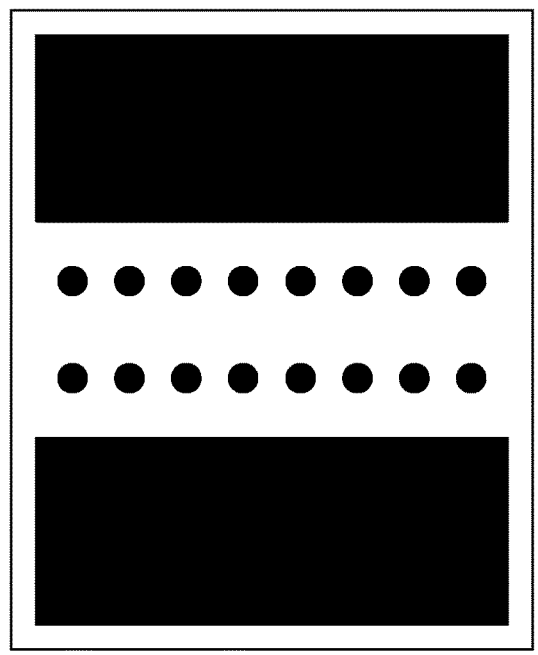
FIG. 8B and FIG. 8C are photomasks used in a method for manufacturing a semiconductor package structure of FIG. 8A according to some exemplary embodiments of the disclosure.
Figure 8C:
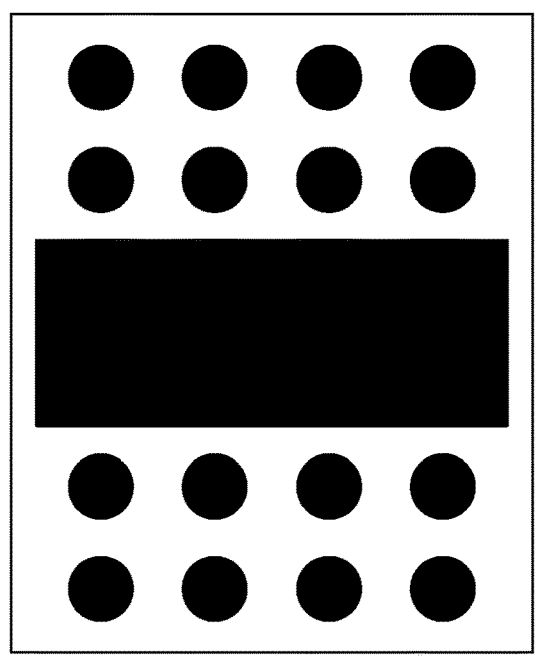

FIG. 8B and FIG. 8C show exemplary photomasks M1b and M2b used in a method for manufacturing the insulating layer 132a2 in the semiconductor package structure of FIG. 8A. Similar to the photomasks M1 and M2 shown in FIG. 7B and FIG. 7C, the photomask M1b in FIG. 8B may provide a first pattern on the first regions A1 of the insulating layer 132a2 through a first exposure, and the photomask M2b in FIG. 8C may provide a second pattern on the second region A2 of the insulating layer 132a2 through a second exposure. In addition, the exposure areas of the first exposure and the second exposure may overlap at stitching zones ST. In the embodiment shown in FIG. 8A, the two ridge structures RS may be formed in the two stitching zones ST through the developing process, for the negative-type photosensitive materials within the stitching zones ST may become more insoluble than other portions of the insulating material layer by being exposed twice during the first exposure and the second exposure. The photomasks M1 and M2 and the photomasks M1b and M2b disclosed herein are only exemplary embodiments, the number of the features and the patterns of the photomasks are not limited by the disclosure.

In the embodiments, through a photolithography process including multi-exposures provided herein, a stitching zone may be formed in at least one layer of the insulating layers and the redistribution layers within a single semiconductor package. The multi-exposures photolithography process may enable more flexible manufacturing process and may be useful under situations when the wafer forming the semiconductor package having warpage, or when the semiconductor package to be produced is large and/or includes fine size features.

In accordance with some embodiments of the disclosure, a semiconductor package is provided. The semiconductor package includes a plurality of semiconductor devices, an insulating layer, and a redistribution layer. The insulating layer is disposed over the semiconductor device. The redistribution layer is disposed over the insulating layer and electrically connected to the semiconductor device. The redistribution layer comprises a conductive line portion. The semiconductor package has a stitching zone, and the insulating layer has a ridge structure on a surface away from the semiconductor device and positioned within the stitching zone.

In accordance with some alternative embodiments of the disclosure, a semiconductor package is provided. The semiconductor package includes a semiconductor device, an insulating layer, and a redistribution layer. The insulating layer is disposed over the semiconductor device. The redistribution layer is disposed over the insulating layer and electrically connected to the semiconductor device. The redistribution layer comprises a conductive line portion. The semiconductor package has a stitching zone, the conductive line portion extends across the stitching zone and comprises a deformed section at the stitching zone, a width of the deformed section is different from other sections of the conductive line portion.

In accordance with some embodiments of the disclosure, a method for manufacturing a semiconductor package is described. Forming an insulating layer over a semiconductor device. Forming the insulating layer includes performing a first exposure by using a first mask to provide a first pattern on a first region of an insulating material layer and performing a second exposure by using a second mask to provide a second pattern on a second region of the insulating material layer to pattern the insulating material layer to form the insulating layer. Forming a redistribution layer over the insulating layer. The semiconductor device is electrically connected to the redistribution layer. The first region overlaps the second region at a first stitching zone.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor package, comprising:
a plurality of semiconductor devices;

an insulating layer, disposed over the plurality of semiconductor devices; and a redistribution layer, disposed over the insulating layer and electrically connected to the plurality of semiconductor devices, the redistribution layer comprises a conductive line portion;

wherein the semiconductor package has a stitching zone, and the insulating layer has a flat structure and a ridge structure next to the flat structure, wherein the ridge structure is protruded away from the plurality of semiconductor devices relative to the flat structure and positioned within the stitching zone.

2. The semiconductor package according to claim 1, wherein a height of the ridge structure is from about 0.1 μm to about 1 μm.

3. The semiconductor package according to claim 1, wherein the ridge structure is in a shape of straight line or L-shape within the semiconductor package.

4. The semiconductor package according to claim 1, wherein the conductive line portion has a curved section, the curved section extends across and conforms to the ridge structure of the insulating layer.

5. The semiconductor package according to claim 1, wherein the stitching zone overlaps at least one of the plurality of semiconductor devices.

6. The semiconductor package according to claim 1, wherein the stitching zone is located at a region between the plurality of semiconductor devices.

7. The semiconductor package according to claim 1, wherein a width of the semiconductor package is above 33 mm.

8. The semiconductor package according to claim 1, wherein the insulating layer further comprising a first region and a second region separated by the stitching zone, and difference between an average height of a top surface of the insulating layer in the first region and in the second region is more than 5 μm.

9. The semiconductor package according to claim 1, wherein the insulating layer further comprising a first region and a second region separated by the stitching zone, and a ratio of a minimum feature size in the first region and the second region is larger than 2.

10. The semiconductor package according to claim 1, wherein the conductive line portion extends across the stitching zone and comprises a deformed section at the stitching zone, and wherein a width of the deformed section is different from other sections of the conductive line portion.

11. A semiconductor package, comprising:
a semiconductor device;
an insulating layer, disposed over the semiconductor device; and
a redistribution layer, disposed over the insulating layer and electrically connected to the semiconductor device, and the redistribution layer comprising a conductive line portion;
wherein the semiconductor package has a stitching zone, the insulating layer has a flat structure and a ridge structure next to the flat structure, the ridge structure is protruded away from the semiconductor device relative to the flat structure and positioned within the stitching zone, the conductive line portion extends across the stitching zone and comprises a deformed section at the stitching zone on the ridge structure, and a width of the deformed section is different from other sections of the conductive line portion on the flat structure.

12. The semiconductor package according to claim 11, wherein the conductive line portion further comprises a first section connected with a first end of the deformed section and a second section connected with a second end of the deformed section, wherein the extension lines of the first section and the second section do not coincide.

13. The semiconductor package according to claim 11, wherein the redistribution layer further comprises an alignment pattern adjacent to the stitching zone of the redistribution layer.

14. A semiconductor package, comprising:
semiconductor devices;
a molding compound disposed between the semiconductor devices; and
a first insulating layer, disposed over the semiconductor devices and the molding compound, the first insulating layer including a first region overlapping the molding compound, a second region overlapping the molding compound and next to the first region, and a third region overlapping one of the semiconductor devices, wherein a top surface of the first insulating layer is leveled higher in the first region than in the second region to form a ridge structure having a width smaller than a gap between the semiconductor devices and the top surface of the insulating layer in the third region is substantially leveled with the top surface of the insulating layer in the second region.

15. The semiconductor package according to claim 14, wherein the ridge structure extends along a linear path or an L-shape path.

16. The semiconductor package according to claim 14, wherein the first insulating layer has a thickness thicker in the first region than in the second region.

17. The semiconductor package according to claim 14, wherein a level difference between the top surface in the first region and the second region is from about 0.1 μm to about 1 μm.

18. The semiconductor package according to claim 14, wherein the first insulating layer is thicker in the first region than in the second region and the third region.

19. The semiconductor package according to claim 14, further comprising a second insulating layer disposed over the first insulating layer.

20. The semiconductor package according to claim 19, wherein a portion of the second insulating layer overlapping the molding compound includes a third region over the first region of the first insulating layer and a fourth region over the second region of the first insulating layer, and a level difference of a top surface of the second insulating layer between the third region and the fourth region is different from a level difference of the top surface of the first insulating layer between the first region and the second region.

* * * * *